United States Patent
Lee et al.

(10) Patent No.: US 7,387,962 B2
(45) Date of Patent: Jun. 17, 2008

(54) PHYSICAL VAPOR DEPOSITION METHODS FOR FORMING HYDROGEN-STUFFED TRENCH LINERS FOR COPPER-BASED METALLIZATION

(75) Inventors: Kyoung-Woo Lee, Fishkill, NY (US); Seung-Man Choi, Fishkill, NY (US)

(73) Assignee: Samsung Electronics Co., Ltd (KR)

( * ) Notice: Subject to any disclaimer, the term of this patent is extended or adjusted under 35 U.S.C. 154(b) by 197 days.

(21) Appl. No.: 11/251,947

(22) Filed: Oct. 17, 2005

(65) Prior Publication Data

US 2007/0087567 A1    Apr. 19, 2007

(51) Int. Cl.
*H01L 21/44* (2006.01)

(52) U.S. Cl. .................. 438/687; 438/629

(58) Field of Classification Search ............ 438/625, 438/629, 631, 653, 687; 257/750, 751, 762
See application file for complete search history.

(56) References Cited

U.S. PATENT DOCUMENTS

| | | | |
|---|---|---|---|
| 6,436,826 B1 | 8/2002 | Pyo | |
| 6,455,422 B1 | 9/2002 | Ngo et al. | |
| 6,551,932 B2 * | 4/2003 | Pyo | ............................ 438/687 |
| 6,554,914 B1 * | 4/2003 | Rozbicki et al. | ............. 148/238 |
| 2002/0045355 A1 | 4/2002 | Chong et al. | |
| 2004/0180483 A1 | 9/2004 | Park et al. | |
| 2004/0192021 A1 | 9/2004 | Li | |
| 2005/0054191 A1 * | 3/2005 | Yu et al. | ...................... 438/629 |

FOREIGN PATENT DOCUMENTS

| | | |
|---|---|---|
| KR | 2001/0076979 A | 8/2001 |
| KR | 2001-0078215 A | 8/2001 |
| KR | 1020010112889 A | 12/2001 |
| KR | 2002-0001143 A | 1/2002 |
| KR | 1020020048267 A | 6/2002 |
| KR | 10-0358050 B1 | 10/2002 |
| KR | 10-0404941 B1 | 10/2003 |
| KR | 10-2005-0002525 A | 1/2005 |

OTHER PUBLICATIONS

Notice of Examination Report for Korean patent application No. 10-2008-0011167; date of mailing Dec. 7, 2006.
Yatsuda et al., "Quantitative Control of Plasma Surface Interactions for Highly Reliable Interconnects", *Proceedings of the IEEE 2004 International Interconnect Technology Conference*, Jun. 7-9, 2004, pp. 90-92.

* cited by examiner

*Primary Examiner*—Kevin M Picardat
(74) *Attorney, Agent, or Firm*—Myers Bigel Sibley & Sajovec, P.A.

(57) ABSTRACT

Copper-based metallization is formed in a trench on an integrated circuit substrate by forming a liner of refractory metal in the trench using physical vapor deposition, forming a copper plating seed layer on the liner using physical vapor deposition and then plating copper on the copper plating seed layer. Prior to plating copper on the copper plating seed layer, the liner and/or copper plating seed layer is stuffed with hydrogen, for example by exposing the liner and/or copper plating seed layer to a hydrogen-containing plasma during and/or after formation of the liner and/or copper plating seed layer. Related structures also are disclosed.

14 Claims, 1 Drawing Sheet

PHYSICAL VAPOR DEPOSITION METHODS FOR FORMING HYDROGEN-STUFFED TRENCH LINERS FOR COPPER-BASED METALLIZATION

FIELD OF THE INVENTION

This invention relates to microelectronic device fabrication methods and structures, and more particularly to copper-based metallization fabrication processes and structures for microelectronic devices.

BACKGROUND OF THE INVENTION

Integrated circuit devices are widely used for consumer, commercial and other applications. As is well known to those having skill in the art, integrated circuit devices typically include a large number of active devices such as transistors in a microelectronic substrate, such as a semiconductor substrate. The devices are interconnected in a desired interconnection pattern using one or more levels of patterned conductor layers, often referred to as "metallization". As the integration density of integrated circuit devices continues to increase, copper-based metallization schemes have been developed to allow improved interconnect performance.

Copper interconnections are often formed using a damascene and/or dual damascene process, wherein trenches and/or vias are formed in one or more dielectric layers, overfilled with copper and then polished to remove the excess copper outside the trenches. Conventionally, a copper-based metallization is formed in a trench on an integrated circuit substrate by forming a liner that comprises refractory metal in the trench, forming a copper plating seed layer on the liner, and then plating copper on the copper plating seed layer. The refractory metal may be tantalum, although other refractory metals such as titanium and tungsten also may be used.

Conventionally, the liner includes a refractory metal nitride layer, such as a tantalum nitride layer, and a refractory metal layer, such as a tantalum layer, on the refractory metal nitride layer. The liner and the copper plating seed layer may be fabricated using physical vapor deposition and/or chemical vapor deposition.

As is well known to those having skill in the art, vapor deposition refers to processes in which materials in a vapor state are condensed through condensation, chemical reaction and/or conversion, to form a solid material. Vapor deposition processes may be classified into physical vapor deposition and chemical vapor deposition.

In physical vapor deposition, a thin film of material is deposited on a substrate by converting the material into vapor by physical means, transporting the vapor across a region of low pressure from its source to the substrate, and causing the vapor to undergo condensation on the substrate to form the thin film. Sputtering is a widely used physical vapor deposition method for integrated circuit fabrication. In sputtering, atoms are dislodged from the surface of a material as a result of collision with high energy particles. The atoms or molecules that are ejected from the target material condense on the substrate as a thin film.

In contrast, chemical vapor deposition refers to formation of a solid film on a substrate from a reaction of vapor phase chemical reactants containing the desired constituents. A reaction chamber is used for this process, into which reactive gases are introduced, to decompose and react with the substrate to form a film. Thus, in chemical vapor deposition, a predefined mix of reactant gases and diluent inert gases are introduced at a specified flow rate into a reaction chamber. The gas species move to the substrate, and the reactants are adsorbed to the surface of the substrate. The reactants undergo chemical reactions with the substrate to form the film. Atomic layer deposition is one form of chemical vapor deposition in which a film is deposited one atomic or molecular layer at a time.

In forming a liner with tantalum and/or tantalum nitride, it is known that these materials may be oxidized by adsorbed water during processing, according to the following chemical reactions:

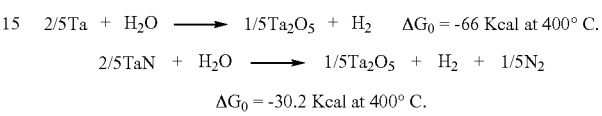

$$2/5\text{Ta} + \text{H}_2\text{O} \longrightarrow 1/5\text{Ta}_2\text{O}_5 + \text{H}_2 \quad \Delta G_0 = -66 \text{ Kcal at } 400°\text{ C.}$$

$$2/5\text{TaN} + \text{H}_2\text{O} \longrightarrow 1/5\text{Ta}_2\text{O}_5 + \text{H}_2 + 1/5\text{N}_2$$

$$\Delta G_0 = -30.2 \text{ Kcal at } 400°\text{ C.}$$

This oxidation can degrade the adhesion between the liner and the subsequently formed copper layers, which can degrade the reliability of the interconnects by creating voids, as described, for example, in Yatsuta et al., *Quantitative Control of Plasma-Surface Interactions for Highly Reliable Interconnects*, Proceedings of the IEEE 2004 International Interconnect Technology Conference, Jun. 7-9, 2004, pp. 90-92. These voids may cause electromigration problems in the interconnect.

It is also known that enough hydrogen partial pressure can reduce or suppress the reaction between Ta/TaN and water, as shown by the following reactions:

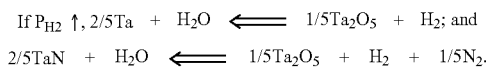

$$\text{If } P_{H_2} \uparrow, 2/5\text{Ta} + \text{H}_2\text{O} \rightleftharpoons 1/5\text{Ta}_2\text{O}_5 + \text{H}_2; \text{ and}$$

$$2/5\text{TaN} + \text{H}_2\text{O} \rightleftharpoons 1/5\text{Ta}_2\text{O}_5 + \text{H}_2 + 1/5\text{N}_2.$$

Accordingly, it is known to perform a hydrogen-containing plasma treatment on a copper-based metallization system, by exposing the plated copper layer to a hydrogen plasma treatment, before depositing a subsequent dielectric layer. This hydrogen pretreatment may be performed at 350° C. after chemical mechanical polishing is performed on the integrated circuit substrate to remove the plated copper, the copper seed layer and/or the liner layer outside the trench, but prior to forming a subsequent dielectric layer on the copper-filled trenches.

It has been found that the hydrogen pretreatment of the copper layers in the trenches can provide electromigration lifetime improvements of up to 5 to 10 times or more. Unfortunately, however, this increase in electromigration lifetime may be accompanied by an undesirable increase in leakage current and/or line resistance of the copper metallization.

SUMMARY OF THE INVENTION

Copper-based metallization may be formed in a trench on an integrated circuit substrate, according to some embodiments of the present invention, by forming a liner comprising refractory metal in the trench using physical vapor deposition, forming a copper plating seed layer on the liner using physical vapor deposition and plating copper on the copper plating seed layer. Prior to plating the copper on the copper plating seed layer, the liner and/or the copper plating seed layer is stuffed with hydrogen. In some embodiments, the liner and/or copper plating seed layer is stuffed with hydrogen by exposing the liner and/or the copper plating seed layer to a hydrogen-containing plasma.

Hydrogen-containing plasma treatment may be performed prior to plating copper on the copper seed layer at one or more times during the liner and/or seed layer formation process, according to various embodiments of the present invention. For example, in some embodiments, the liner comprises a refractory metal nitride layer and a refractory metal layer on the refractory metal nitride layer, that are both formed using physical vapor deposition, and the refractory metal nitride layer and/or the refractory metal layer is exposed to a hydrogen-containing plasma. The refractory metal nitride layer and/or the refractory metal layer may be exposed to a hydrogen-containing plasma during and/or after physical vapor deposition thereof. In other embodiments, the copper plating seed layer is exposed to a hydrogen-containing plasma during and/or after physical vapor deposition thereof.

In some embodiments, a single hydrogen-containing plasma treatment may be performed prior to plating the copper on the copper seed layer. A single hydrogen plasma treatment may suffice because of the relatively high mobility of hydrogen, so that the hydrogen can diffuse throughout the liner. However, in other embodiments, multiple hydrogen plasma treatments may be performed at two or more of the above-described times in the process flow.

Copper-based metallization structures for integrated circuit substrates according to various embodiments of the invention include a liner that comprises refractory metal and hydrogen on a trench floor and on a trench sidewall, and that is thinner on the trench sidewall than on the trench floor. A copper plating seed layer on the diffusion liner also includes hydrogen and is also thinner on the trench sidewall than on the trench floor. A copper layer is provided on the copper plating seed layer in the trench. In some embodiments, the liner and the copper plating seed layer are free of carbon therein. Moreover, in intermediate structures, the liner and the copper plating seed layer also extend on the surface of the substrate outside the trench, and the liner and copper plating seed layer are thicker on the surface outside the trench than on the trench sidewall.

DETAILED DESCRIPTION

Figure 1:
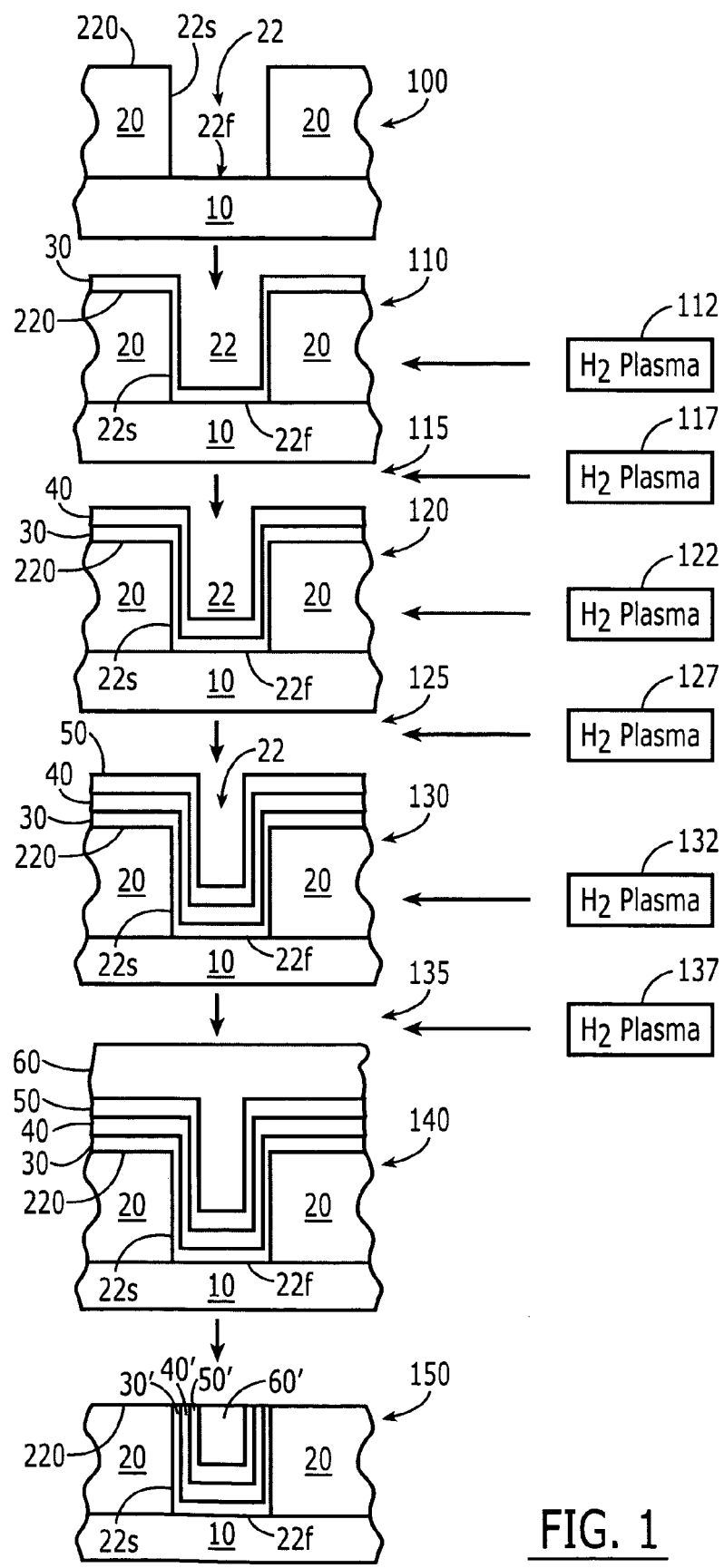
FIG. 1 is a process flow diagram that illustrates cross-sectional views of copper-based metallizations according to various embodiments of the present invention during intermediate fabrication steps according to various embodiments of the present invention, including various combinations and subcombinations of hydrogen plasma liner stuffing according to various embodiments of the present invention.

The invention will be described more fully hereinafter with reference to the accompanying drawings, in which example embodiments of the invention are shown. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element or layer is referred to as being "on", "connected to" and/or "coupled to" another element or layer, it can be directly on, connected or coupled to the other element or layer or intervening elements or layers may be present. In contrast, when an element is referred to as being "directly on," "directly connected to" and/or "directly coupled to" another element or layer, there are no intervening elements or layers present. As used herein, the term "and/or" may include any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms may be used to distinguish one element, component, region, layer and/or section from another region, layer and/or section. For example, a first element, component, region, layer and/or section discussed below could be termed a second element, component, region, layer and/or section without departing from the teachings of the present invention.

Spatially relative terms, such as "beneath", "below", "lower", "above", "upper" and the like, may be used herein for ease of description to describe an element and/or a feature's relationship to another element(s) and/or feature(s) as illustrated in the figures. It will be understood that the spatially relative terms are intended to encompass different orientations of the device in use or operation in addition to the orientation depicted in the figures. For example, if the device in the figures is turned over, elements described as "below" and/or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular terms "a", "an" and "the" are intended to include the plural forms as well, unless the context clearly indicates otherwise. It will be further understood that the terms "comprises," "comprising," "includes" and/or "including" when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, may be expected. Thus, the disclosed example embodiments of the invention should not be construed as limited to the particular shapes of regions illustrated herein unless expressly so defined herein, but are to include deviations in shapes that result, for example, from manufacturing. For example, a trench will, typically, have rounded or curved corners. Thus, the regions illustrated in the figures are schematic in nature and their shapes are not intended to illustrate the actual shape of a region of a device and are not intended to limit the scope of the invention, unless expressly so defined herein.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Some embodiments of the present invention arise from a recognition that hydrogen plasma treatment may be performed on a refractory metal liner and/or on a copper plating seed layer, to thereby stuff the liner and/or copper plating seed layer with hydrogen prior to copper plating on the copper seed layer. By performing hydrogen plasma treatment prior to plating the copper layer, the liner and/or seed layer may be stuffed with hydrogen, to thereby reduce or prevent electromigration problems, while allowing the resistance and/or leakage of the copper metallization to remain low.

Referring now to FIG. 1, an integrated circuit substrate 10 is shown in cross-sectional view 100. The integrated circuit substrate 10 may be a single element semiconductor, compound semiconductor and/or non-semiconductor substrate, including one or more semiconductor, insulator and/or conductive layers thereon. The integrated circuit substrate 10 also includes a layer 20 thereon, which may be a dielectric layer and/or a conductive layer having an insulating coating, to define a trench 22 therein. The trench includes a trench floor 22f and a trench sidewall 22s. The trench 22 also defines an outside surface 22o that is outside the trench. The design and manufacture of integrated circuit substrates 10, including layers 20 and trenches 22, are well known to those having skill in the art and need not be described further herein. Moreover, it will also be understood that the trench 22 may be combined with an underlying via, to provide interconnection to an underlying conductive layer, and may be metallized using a damascene process that is well known to those having skill in the art. Damascene processes for metallizing a trench, including dual damascene processes for metallizing a trench and an underlying via, are well known to those having skill in the art, and need not be described further herein.

Continuing with the description of FIG. 1, at cross-section 110, a liner is formed in the trench 22 by forming a refractory metal nitride layer 30, such as a tantalum nitride layer, using physical vapor deposition. The fabrication of a refractory metal nitride layer 30 using physical vapor deposition is well known to those having skill in the art and need not be described further herein. Moreover, it will be understood by those having skill in the art that when fabricating a refractory metal nitride layer 30 using physical vapor deposition, the refractory metal nitride layer 30 on the horizontal surfaces shown in view 110 may be thicker than the portion of the refractory metal nitride layer on the vertical surfaces shown in view 110. Thus, the portions of the refractory metal nitride layer 30 on the trench floor 22f and on the outside surface 22o are thicker than the portion of the refractory metal nitride layer 30 on the sidewall 22s. For example, in some embodiments, the refractory metal nitride layer 30 on the outside surface 22o may be about 100 Å thick, the refractory metal nitride layer 30 on the trench floor 22f may be about 50 Å thick, and the refractory metal nitride layer 30 on the sidewall may be between about 10 Å and about 20 Å thick. Moreover, the refractory metal nitride layer 30 may be free of carbon therein, because the physical vapor deposition may be performed under high vacuum (for example, less than $10^{-9}$ torr) using pure gas (such as argon and/or nitrogen with a purity of more than 99.9999%), whereas chemical vapor deposition and atomic layer deposition typically are performed using precursors including carbon. In some embodiments, carbon levels of less than about several parts per million (ppm) may be provided in refractory metal nitride layer 30.

As also shown in FIG. 1, in some embodiments of the present invention, hydrogen-containing plasma treatment 112 is performed during physical vapor deposition of the refractory metal nitride layer 30. In some embodiments, the hydrogen plasma treatment 112 may be performed for the entire time that the physical vapor deposition of layer 30 is performed. Hydrogen plasma treatment may be performed in some embodiments of the present invention, by adding hydrogen gas to the ambient in the physical vapor deposition (such as sputtering) chamber. The conditions in the chamber can form a hydrogen plasma in addition to forming a plasma from the target that is used for refractory metal nitride sputtering.

Still referring to FIG. 1, after physical vapor deposition of the refractory metal nitride layer 30, but before physical deposition of a refractory metal layer 40, as indicated by arrow 115, a hydrogen plasma treatment 117 may be performed instead of or in addition to the earlier-described hydrogen plasma treatment 112. This hydrogen plasma treatment 117 may be performed in a separate chamber or by covering or removing the sputtering target that was used to form the refractory metal nitride layer 30.

Continuing with the description of FIG. 1, at cross-section 120, the liner formation is continued by forming a refractory metal layer 40, such as a tantalum layer, on the underlying refractory metal nitride layer 30 using physical vapor deposition. The fabrication of a refractory metal layer 40 using physical vapor deposition is well known to those having skill in the art and need not be described further herein. Moreover, it will be understood by those having skill in the art that when fabricating a refractory metal layer 40 using physical vapor deposition, the refractory metal layer 40 on the horizontal surfaces shown in view 120 may be thicker than the portion of the refractory metal layer on the vertical surfaces shown in view 120. Thus, the portions of the refractory metal layer 40 on the trench floor 22f and on the outside surface 22o are thicker than the portion of the refractory metal layer 40 on the sidewall 22s. For example, in some embodiments, the refractory metal layer 40 on the outside surface 22o may be about 100 Å thick, the refractory metal layer 40 on the trench floor 22f may be about 50 Å thick, and the refractory metal layer 40 on the sidewall may be between about 10 Å and about 20 Å thick. Moreover, the refractory metal layer 40 may be free of carbon therein, because the physical vapor deposition may be performed under high vacuum (for example, less than $10^{-9}$ torr) using pure gas (such as argon and/or nitrogen with a purity of more than 99.9999%), whereas chemical vapor deposition and atomic layer deposition typically are performed using precursors including carbon. For example, carbon levels of less than about several parts per million (ppm) may be provided in refractory metal layer 40.

As also shown in FIG. 1, in some embodiments of the present invention, a hydrogen-containing plasma treatment 122 is performed during physical vapor deposition of the refractory metal layer 40. In some embodiments, the hydrogen plasma treatment 122 may be performed for the entire time that the physical vapor deposition of layer 40 is performed. Hydrogen plasma treatment may be performed in some embodiments of the present invention, by adding hydrogen gas to the ambient in the physical vapor deposition (such as sputtering) chamber. The conditions in the chamber can form a hydrogen plasma in addition to forming a plasma from the target that is used for refractory metal sputtering.

Still referring to FIG. 1, after physical vapor deposition of the refractory metal layer 40, and before physical deposition of a copper plating seed layer 50, as indicated by arrow 125, hydrogen plasma treatment 127 may be performed instead of or in addition to the earlier-described hydrogen plasma treatments. This hydrogen plasma treatment 127 may be performed in a separate chamber or by covering or removing the sputtering target that was used to form the refractory metal layer 40.

Referring now to cross-section 130 of FIG. 1, a copper plating seed layer 50 is formed on the refractory metal layer 40 using physical vapor deposition. The fabrication of a copper plating seed layer 50 using physical vapor deposition is well known to those having skill in the art and need not be described further herein. Moreover, it will be understood by those having skill in the art that when fabricating a copper plating seed layer 50 using physical vapor deposition, the copper plating seed layer 50 on the horizontal surfaces shown in view 130 may be thicker than the portion of the layer on the vertical surfaces shown in view 130. Thus, the portions of the copper plating seed layer 50 on the trench floor 22f and on the outside surface 22o are thicker than the portion of the copper plating seed layer 50 on the sidewall 22s. For example, in some embodiments, the copper plating seed layer 50 on the outside surface 22o may be about 100 Å thick, the copper plating seed layer 50 on the trench floor 22f may be about 50 Å thick, and the cooper plating seed layer 50 on the sidewall may be between about 10 Å and about 20 Å thick. Moreover, the copper plating seed layer 50 may be free of carbon therein, because the physical vapor deposition may be performed under high vacuum (for example, less than $10^{-9}$ torr) using pure gas (such as argon and/or nitrogen with a purity of more than 99.9999%), whereas chemical vapor deposition and atomic layer deposition typically are performed using precursors including carbon. For example, carbon levels of less than about several parts per million (ppm) may be provided in copper plating seed layer 50.

As also shown in FIG. 1, in some embodiments of the present invention, hydrogen-containing plasma treatment 132 is performed during physical vapor deposition of copper plating seed layer 50. In some embodiments, the hydrogen plasma treatment may be performed for the entire time that the physical vapor deposition of layer 50 is performed. Hydrogen plasma treatment may be performed in some embodiments of the present invention, by adding hydrogen gas to the ambient in the physical vapor deposition (such as sputtering) chamber. The conditions in the chamber can form a hydrogen plasma in addition to forming a plasma from the target that is used for copper plating seed sputtering.

Still referring to FIG. 1, after physical vapor deposition of the copper plating seed layer 50, and before plating of a copper layer 60, as indicated by arrow 135, hydrogen plasma treatment 137 may be performed instead of or in addition to the earlier-described hydrogen plasma treatments. This hydrogen plasma treatment 137 may be performed in a separate chamber or by covering or removing the sputtering target that was used to form the copper plating seed layer 50.

Continuing with the description of FIG. 1, at cross-section 140, a copper layer 60 is plated on the copper plating seed layer 50. The plating of a copper layer 60 on a copper plating seed layer 50 is well known to those having skill in the art and need not be described further herein. In some embodiments, the copper layer may be between about 5000 Å and about 15000 Å thick outside the trench 22.

Finally, referring to cross-section 150 of FIG. 1, chemical mechanical polishing and/or other techniques may be used to remove the copper layer 60, the copper plating seed layer 50, the refractory metal layer 40 and the refractory metal nitride layer outside the trench 20, to form a refractory metal nitride layer 30', a refractory metal layer 40', a copper plating layer 50' and a copper layer 60' in the trench 22. The use of chemical mechanical polishing and/or other techniques is well known to those having skill in the art and need not be described further herein. The refractory metal nitride layer 30' and the refractory metal layer 40' in the trench may be referred to as a liner, and may also be referred to as a diffusion barrier liner.

Additional discussion of various embodiments of the present invention now will be provided. In some embodiments, only one of the hydrogen plasma treatments 112, 117, 122, 127, 132 or 137 of FIG. 1 need be performed, because hydrogen may diffuse readily along grain boundaries of the refractory metal nitride layer 30, the refractory metal layer 40 and/or the copper plating seed layer 50, so as to stuff these layers with hydrogen, as long as the hydrogen is introduced into one of these layers prior to formation of the copper layer 60. However, in other embodiments of the present invention, various combinations and subcombinations of the hydrogen plasma treatments 112, 117, 122, 127, 132 and 137 may be used. According to some embodiments of the present invention, by stuffing hydrogen into grain boundaries of the liner 30'/40', electromigration reliability can be increased markedly, without substantially degrading the resistance of the plated copper layer, which may result from hydrogen stuffing into the grain boundaries of the plated copper layer 60', and without substantially increasing the leakage which may be caused by dielectric damage when hydrogen plasma is used after chemical mechanical polishing of the copper layer.

It will also be understood by those having skill in the art that the liner may include fewer more than the two layers 30' and 40' that were illustrated in FIG. 1. For example, the liner may include separate layers of tantalum nitride and tantalum, and hydrogen stuffing may be performed during, between and/or after fabrication of any of these layers. Without wishing to be bound by any theory of operation, the use of a hydrogen plasma prior to plating copper 60 on the copper plating seed layer 50 according to exemplary embodiments of the present invention, can stuff hydrogen into grain boundaries of the liner 40/50 and/or copper plating seed layer 60, and can also provide hydrogen partial pressure, which can reduce or suppress the reaction between tantalum and/or tantalum nitride and water.

A hydrogen-stuffed layer formed by physical vapor deposition according to various embodiments of the invention can be structurally distinguished from a hydrogen-stuffed layer formed by chemical vapor deposition. For example, chemical vapor deposition, including atomic layer deposition, generally forms a layer of uniform thickness on the trench floor, on the trench sidewall and on the surface outside the trench, whereas physical vapor deposition, such as sputtering, generally forms a thinner layer on the trench sidewall than on the trench floor or outside the trench. Moreover, a structure fabricated by physical vapor deposition may be substantially free of carbon, whereas a structure fabricated using chemical vapor deposition may include carbon therein.

Accordingly, embodiments of the present invention can reduce or eliminate the formation of voids in copper-based metallization, without unduly increasing the resistance and/or leakage of the copper metallization.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A method of forming copper-based metallization in a trench on an integrated circuit substrate, comprising:
    forming a liner comprising refractory metal in the trench using physical vapor deposition;
    forming a copper plating seed layer on the liner using physical vapor deposition; and
    plating copper on the copper plating seed layer;
    wherein forming a copper plating seed layer on the liner is preceded by stuffing the liner with hydrogen.

2. A method according to claim 1 wherein stuffing the liner with hydrogen comprises exposing the liner to a hydrogen-containing plasma.

3. A method according to claim 1 wherein forming a liner comprising refractory metal in the trench using physical vapor deposition comprises forming a liner comprising a refractory metal nitride layer and a refractory metal layer on the refractory metal nitride layer in the trench using physical vapor deposition, and wherein stuffing the liner with hydrogen comprises exposing the refractory metal nitride layer and/or the refractory metal layer to a hydrogen-containing plasma.

4. A method according to claim 3 wherein exposing the refractory metal nitride layer and/or the refractory metal layer to a hydrogen-containing plasma comprises exposing the refractory metal nitride layer and/or the refractory metal layer to a hydrogen-containing plasma during physical vapor deposition thereof.

5. A method according to claim 3 wherein exposing the refractory metal nitride layer and/or the refractory metal layer to a hydrogen-containing plasma comprises exposing the refractory metal nitride layer and/or the refractory metal layer to a hydrogen-containing plasma after physical vapor deposition thereof.

6. A method according to claim 1 wherein stuffing the liner with hydrogen comprises exposing the liner to a hydrogen-containing plasma during and/or after physical vapor deposition thereof.

7. A method according to claim 2 wherein exposing the liner to a hydrogen-containing plasma is repeatedly performed prior to forming the copper plating seed layer.

8. A method according to claim 1 wherein forming a liner, forming a copper plating seed layer and plating copper are all performed outside the trench as well as in the trench and wherein plating copper is followed by chemical-mechanical polishing the integrated circuit substrate to remove the plated copper, the copper seed layer and the liner outside the trench.

9. A method of forming copper-based metallization in a trench on an integrated circuit substrate, comprising:
    forming a liner comprising refractory metal in the trench using physical vapor deposition;
    forming a copper plating seed layer on the liner using physical vapor deposition; and
    plating copper on the copper plating seed layer;
    wherein forming a copper plating seed layer on the liner is preceded by exposing the liner to a hydrogen-containing plasma.

10. A method according to claim 9 wherein forming a liner comprising refractory metal in the trench using physical vapor deposition comprises forming a liner comprising a refractory metal nitride layer and a refractory metal layer on the refractory metal nitride layer in the trench using physical vapor deposition, and wherein exposing the liner to a hydrogen-containing plasma comprises exposing the refractory metal nitride layer and/or the refractory metal layer to a hydrogen-containing plasma.

11. A method according to claim 10 wherein exposing the refractory metal nitride layer and/or the refractory metal layer to a hydrogen-containing plasma comprises exposing the refractory metal nitride layer and/or the refractory metal layer to a hydrogen-containing plasma during physical vapor deposition thereof.

12. A method according to claim 10 wherein exposing the refractory metal nitride layer and/or the refractory metal layer to a hydrogen-containing plasma comprises exposing the refractory metal nitride layer and/or the refractory metal layer to a hydrogen-containing plasma after physical vapor deposition thereof.

13. A method according to claim 9 wherein exposing the liner to a hydrogen-containing plasma comprises exposing the liner to a hydrogen-containing plasma during and/or after physical vapor deposition thereof.

14. A method according to claim 9 wherein exposing the liner to a hydrogen-containing plasma is repeatedly performed prior to forming the copper plating seed layer.

* * * * *